United States Patent
Udrea et al.

(10) Patent No.: US 10,636,777 B2
(45) Date of Patent: Apr. 28, 2020

(54) INFRA-RED DEVICE

(71) Applicant: AMS Sensors UK Limited, Cambridge (GB)

(72) Inventors: Florin Udrea, Cambridge (GB); Syed Zeeshan Ali, Cambridge (GB); Richard Henry Hopper, Cambridge (GB); Rainer Minixhofer, Premstaetten (AT)

(73) Assignee: AMS SENSORS UK LIMITED, Cambridge (GB)

( * ) Notice: Subject to any disclaimer, the term of this patent is extended or adjusted under 35 U.S.C. 154(b) by 0 days.

(21) Appl. No.: 15/852,257

(22) Filed: Dec. 22, 2017

(65) Prior Publication Data

US 2019/0198487 A1 Jun. 27, 2019

(51) Int. Cl.
*H01L 21/00* (2006.01)
*H01L 25/16* (2006.01)
(Continued)

(52) U.S. Cl.
CPC ............ *H01L 25/165* (2013.01); *G01J 5/024* (2013.01); *G01J 5/0225* (2013.01); *G01J 5/045* (2013.01); *G01J 5/0815* (2013.01); *H01L 23/13* (2013.01); *H01L 23/26* (2013.01); *H01L 23/481* (2013.01); *H01L 35/02* (2013.01); *H01L 35/08* (2013.01); *H01L 35/10* (2013.01); *H01L 35/32* (2013.01); *H01L 35/34* (2013.01); *H05B 3/36* (2013.01); *H01L 21/78* (2013.01); *H01L 24/11* (2013.01);
(Continued)

(58) Field of Classification Search
CPC ...... H01L 25/165; H01L 23/26; H01L 23/481
See application file for complete search history.

(56) References Cited

U.S. PATENT DOCUMENTS 5,285,131 A * 2/1994 Muller .................... G01J 3/108
313/315
5,500,569 A 3/1996 Blomberg et al.
(Continued)

FOREIGN PATENT DOCUMENTS

CN 102583220 7/2012
CN 102 583 220 B 11/2014
(Continued)

OTHER PUBLICATIONS

Parameswaran, M. et al., "Micromachined Thermal Radiation Emitter from a Commercial CMOS Process", IEEE Electron Device Letters, vol. 12, No. 2, Feb. 1991, pp. 57-59.
(Continued)

*Primary Examiner* — Laura M Menz
(74) *Attorney, Agent, or Firm* — Tucker Ellis LLP (57) ABSTRACT

We disclose an Infrared (IR) device comprising a first substrate comprising a first cavity; a dielectric layer disposed on the first substrate; a second substrate disposed on the dielectric layer and on the opposite side of the first substrate, the second substrate having a second cavity. The device further comprises an optically transmissive layer attached to one of the first and second substrates; a further layer provided to another of the first and second substrates so that the IR device is substantially closed. Holes are provided through the dielectric layer so that a pressure in the first cavity is substantially the same level as a pressure in the second cavity.

19 Claims, 10 Drawing Sheets

(51) Int. Cl.
*H01L 23/26* (2006.01)
*H01L 23/48* (2006.01)
*H01L 35/10* (2006.01)
*H01L 35/02* (2006.01)
*H01L 35/32* (2006.01)
*H01L 35/08* (2006.01)
*H01L 35/34* (2006.01)
*H05B 3/36* (2006.01)
*H01L 23/13* (2006.01)
*G01J 5/02* (2006.01)
*G01J 5/08* (2006.01)
*G01J 5/04* (2006.01)
*H01L 23/00* (2006.01)
*H01L 21/78* (2006.01)

(52) U.S. Cl.
CPC .............. *H01L 24/13* (2013.01); *H01L 24/48* (2013.01); *H01L 2224/13025* (2013.01); *H01L 2224/4845* (2013.01); *H01L 2924/13091* (2013.01)

(56) References Cited

U.S. PATENT DOCUMENTS

| | | | |
|---|---|---|---|
| 5,644,676 | A | 7/1997 | Blomberg et al. |
| 5,827,438 | A | 10/1998 | Blomberg et al. |
| 6,036,872 | A | 3/2000 | Wood et al. |
| 6,297,511 | B1 | 10/2001 | Syllaios et al. |
| 7,741,625 | B2 * | 6/2010 | Rogne ............... G01J 3/108 250/495.1 |
| 8,350,346 | B1 * | 1/2013 | Huang ................. B81B 3/0051 257/414 |
| 9,608,731 | B2 * | 3/2017 | Gudeman ........... B81C 1/00301 |
| 2005/0081905 | A1 | 4/2005 | Lan et al. |
| 2008/0272389 | A1 * | 11/2008 | Rogne ................ G01J 3/108 257/99 |
| 2012/0267532 | A1 * | 10/2012 | Udrea ................... H05B 3/267 250/338.5 |
| 2012/0326248 | A1 * | 12/2012 | Daneman ................ B81B 7/02 257/415 |
| 2014/0291704 | A1 * | 10/2014 | Ali ...................... H01L 33/34 257/88 |

FOREIGN PATENT DOCUMENTS

| | | | | |
|---|---|---|---|---|
| EP | 2056337 | A2 | 5/2009 | |
| EP | 2916118 | A1 | 9/2015 | |
| GB | 2542801 | A | 4/2017 | |
| WO | 02/080620 | A1 | 10/2002 | |
| WO | WO-2005055317 | A1 * | 6/2005 | ............ H01L 23/04 |
| WO | WO-2006031125 | A1 * | 3/2006 | ............ G01J 3/108 |
| WO | 2006124597 | A2 | 11/2006 | |
| WO | 2017089604 | A1 | 6/2017 | |

OTHER PUBLICATIONS

Bauer, D. et al., "Design and fabrication of a thermal infrared emitter", Institute for Microsensors, actuators and systems (IMSAS), Department of Physics and Electrical Engineering, University of Bremen,1996, pp. 57-63.

Yuasa H. et al.,"Single Crystal Silicon Micromachined Pulsed Infrared Light Source," Transducers '97, International Conference on Solid-state Sensors and Actuators, Jun. 16-19, 1997, pp. 1271-1274.

Cole, B. et al, "Monolithic Two-Dimensional Arrays of Micromachined Microstructures for Infrared Applications", Proceedings of the IEEE, vol. 86, No. 8, Aug. 1998, pp. 1679-1686.

Hildenbrand J. et al., "Micromachined Mid-Infrared Emitter for Fast Transient Temperature Operation for Optical Gas Sensing Systems", IEEE Sensors 2008 Conference, 2008, pp. 297-300.

Ji X. et al, "A MEMS IR Thermal Source for NDIR Gas Sensors", IEEE, 2006.

Schneeberger, N. et al., "Optimized CMOS Infrared Detector Microsystems", Physical Electronics Laboratory, Zurich, IEEE, 1995, pp. 198-201.

Graf, A. et al., "Review of Micromachined Thermopiles for Infrared Detection", Measurement Science and Technology 18 (2007) R59-R75, 2007.

Kim, J-K et al., "A New Uncooled Thermal Infrared Detector Using Silicon Diode", Sensors and Actuators A 89 (2001) pp. 22-27, 2001.

Sah, P-T et al., "A Silicon Micromachined Infrared Emitter Based on SOI wafer", MEMS/MOEMS Technologies and Applications III, Proc. of SPIE vol. 6836, 2007.

Spannhake J. et al., "High-Temperature MEMS Heater Platforms: Long-term Performance of Metal and Semiconductor Heater Materials", Sensors, ISSN 1424-8220, pp. 405-419, 2006.

Weber, M. et al, "Improved Design for Fast Modulating IR Sources", J. Micromech. Microeng. 7, pp. 210-213, Oct. 21, 1996.

Lebental, Barritault, et al., "Mid-IR source based on a free-standing microhotplate for autonomous CO2 sensing in indoor applications", IOP Publishing, Sep. 2, 2011; 7 pages.

International Search Report and Written Opinion from corresponding International Application No. PCT/GB2018/053737 dated Mar. 18, 2019, 14 pages.

\* cited by examiner

INFRA-RED DEVICE

TECHNICAL FIELD OF THE DISCLOSURE

The disclosure relates to infra-red (IR) devices, particularly but not exclusively, to micro-machined IR devices.

BACKGROUND OF THE DISCLOSURE

Infrared devices can be either infrared emitters, or infrared detectors. Micro-machined IR emitters and detectors have the advantage of low cost and small size. However, packaging can often greatly increase the size and cost of the devices, and hence partially negate these advantages. In particular the use of the filter, window or lens can greatly increase cost. Furthermore, for thermal IR emitters or detectors it is generally beneficial to have the device packaged in vacuum or a gas with low thermal conductivity as it greatly reduces the power consumption for IR emitters, and increases the sensitivity of IR detectors. However, vacuum packaging or gas sealing at a package level can be very expensive and for some packaging technologies is not possible.

Thermal infrared emitters and infrared detectors are both well known in literature and the mininituarised versions are fabricated using micro-machined processes. Thermal infrared emitters typically include a resistive micro-heater embedded within a thin membrane and supported on a silicon substrate. When current is passed through the heater, it heats up to a high temperature (which can be as much as 700° C. or even higher), and at this high temperature, the device emits infrared radiation.

A number of designs of IR emitters have been reported.

For example, Parameswaran et. al. "Micro-machined thermal emitter from a commercial CMOS process," IEEE EDL 1991 reports a polysilicon heater for IR applications made in CMOS technology, with a front side etch to suspend the heater and hence reduce power consumption. Similarly, D. Bauer et. Al. "Design and fabrication of a thermal infrared emitter" Sens & Act A 1996, also describes an IR source using a suspended polysilicon heater. U.S. Pat. No. 5,285,131 by Muller et al.; US2008/0272389 by Rogne et. Al; and San et. al. "A silicon micromachined infrared emitter based on SOI wafer" (Proc of SPIE 2007) also describe similar devices using a polysilicon heater.

Yuasa et. al "Single Crystal Silicon Micromachined Pulsed Infrared Light Source" Transducers 1997, describe an infrared emitter using a suspended boron doped single crystal silicon heater. Watanabe, in EP2056337, describes a suspended silicon filament as an IR source. The device is vacuum sealed by bonding a second substrate. Cole et. al. "Monolithic Two-Dimensional Arrays of Micromachined Microstructures for Infrared Applications" (proc of IEEE 1998) describe an IR source on top of CMOS processed device.

Designs based on a platinum heater have also been described. For example, Hildenbrand et. al. "Micromachined Mid-Infrared Emitter for Fast Transient Temperature Operation for Optical Gas Sensing Systems", IEEE Sensor 2008 Conference, reports on a platinum heater on a suspended membrane for IR applications.

Similarly Ji et. Al. "A MEMS IR Thermal Source For NDIR Gas Sensors" (IEEE 2006) and Barritault et. al "Mid-IR source based on a free-standing microhotplate for autonomous CO2 sensing in indoor applications" (Sensors & Actuators A 2011), Weber et. al. "Improved design for fast modulating IR sources", Spannhake et. Al. "High-temperature MEMS Heater Platforms: Long-term Performance of Metal and Semiconductor Heater Materials" (Sensors 2006) also describe platinum based as well as other emitters.

Some other IR emitter designs are disclosed by U.S. Pat. No. 6,297,511 by Syllaios et. al., U.S. Pat. Nos. 5,500,569, 5,644,676, 5,827,438 by Bloomberg et. al, and WO 02/080620 A1 by Pollien et. al.

Thermal IR detectors on a silicon substrate comprise a thin membrane layer (made of electrically insulating layers) that is formed by etching of part of the substrate. Heating due to incident IR radiation increases the temperature of the membrane—which can be measured by either a thermopile, a resistor, or a diode.

For Example, Schneeberger et. al "Optimized CMOS Infrared Detector Microsystems," Proc IEEE Tencon 1995, reports fabrication of CMOS IR detectors based on thermopiles. The thermopile consists of several thermocouples connected in series. KOH (potassium hydroxide) is used to etch the membrane and improve the thermal isolation. Each thermocouple includes 2 strips of different materials, connected electrically and forming a thermal junction at one end (termed hot junction) while the other ends of the material are electrically connected to other thermocouples in series forming a thermal cold junction. The hot junctions of the thermocouples are on the membrane, while the cold junctions are outside the membrane. Three different designs of the thermocouples are given in the paper with different material compositions: either Aluminium and p-doped polysilicon, Aluminium and n-doped Polysilicon, or p-doped polysilicon and n-doped polysilicon. Heating due to absorption of incident IR radiation causes a slight increase in the temperature of the membrane. The Seebeck effect causes a slight voltage difference across each thermocouple—resulting in a much larger increase in voltage difference across the thermopile which is the sum of the voltages across each thermocouple.

Several other thermopile devices are described by Graf et. al. "Review of micromachined thermopiles for infrared detection" Meas. Sci. Technol. 2007.

Another method of detecting IR radiation is by the use of thermodiodes. For example, Kim "A new uncooled thermal infrared detector using silicon diode," S&A A 89, 2001, describes a diode fabricated by micromachining for use as an IR detector. However, the dome shaped silicon nitride window can be fragile and the irregular shape can affect the emission profile of the device.

However the packaging in all these uses metal, ceramic or plastic packaging. These can be TO packages, as in: San et. Al. "A silicon micromachined infrared emitter based on silicon on insulator (SOI) wafer," SPIE Digital Library 2008; Hildenbrand et. Al. "Micromachined Mid-Infrared Emitter for Fast Transient Temperature Operation for Optical Gas Sensing Systems" Proceedings of IEEE Sensors Conference 2008; Ji et. Al. "A MEMS IR Thermal Source for NDIR Gas Sensors" (IEEE 2006).

Several SMD (surface mount device) packages are also found in commercial IR products.

There are however very few reports of chip or wafer level packaged sensors.

U.S. Pat. No. 5,285,131 describes an IR emitter, consisting of a polysilicon filament suspended over a silicon substrate and sealed in a vacuum with a dome shaped silicon nitride window. However, the filament is supported on only 2 sides, and so is relatively fragile. Furthermore, as it is a filament, the heated area is very small, resulting is a lower amount of IR radiation. Lastly, the dome shaped silicon nitride window is not very easy to fabricate, particularly to ensure that it does not buckle.

US20050081905 describes a thermopile IR detector encapsulated by sealing on the top and bottom at chip level. However, the cavity in the package in not a vacuum, or a low thermal conductivity gas, so the performance of the sensor is not enhanced. The package simply provides a small low cost packaged device.

U.S. Pat. No. 7,741,625 discloses an IR emitter packaged at chip level in vacuum. However, the device uses a silicon membrane which greatly increases power consumption. The device has no method to maintain the vacuum in the cavity which may slowly increase in pressure over time due to minor leakages. It also relies on providing electrical connection to the emitter through the semiconductor substrate which typically has high resistance resulting in high voltage requirements and/or higher power consumption.

U.S. Pat. No. 6,036,872 and CN102583220 generally relate to wafer level and vacuum packaging.

SUMMARY

This disclosure proposes to overcome these problems by the use of wafer level packaging with an integrated filter/lens and a vacuum cavity formed during the packaging process and maintained by the use of a getter material.

The state-of-the art IR emitters and detectors are based on traditional packaging methods involving (i) fabrication of wafers containing IR devices (ii) dicing (iii) packaging individual dies and adding filters, caps, lenses. In this disclosure, we propose a different way of building IR devices, without the need for individual packaging. According to this disclosure, the IR devices will be packaged at wafer level, will have potentially filters/caps/lenses built at wafer level and will be hermetically sealed in vacuum or a low thermally conductive gas to reduce heat losses and increase efficiency. Through-Semiconductor-Vias also known as Through-Silicon-Vias (TSV) will be provided to connect the IR device to circuits such as read-out drive and processing.

The sequence will be (i) fabrication of wafers containing IR devices (ii) adding top and bottom structures, including filters/caps/lenses at wafer level to seal individual IR devices (iii) forming TSVs on either bottom or top structures to connect the IR device (iv) adding solder bumps and/or 3D interconnections (iii) singulating individual devices According to one aspect of the present disclosure, there is provided an Infrared (IR) device comprising: a first substrate comprising a first cavity; a dielectric layer disposed on the first substrate; a second substrate disposed on the dielectric layer and on the opposite side of the first substrate, the second substrate having a second cavity; an optically transmissive layer attached to one of the first and second substrates; a further layer provided to another of the first and second substrates so that the IR device is substantially closed. Holes are provided through the dielectric layer so that the pressure in the first cavity is substantially the same level as the pressure in the second cavity. Here the further layer or an additional layer is provided to hermetically seal the infrared device. The substrates can be a semiconductor substrate. It may be also possible to package the infrared devices by using only one substrate and one cavity either on top or below the dielectric layer. In such a scenario, the device will be hermetically sealed as well, but will not have the holes in the dielectric layer.

The first cavity and the second cavity may have vacuum with substantially the same pressure level.

The device may further comprise a getter material within one of the cavities to maintain the vacuum.

Alternatively, the first cavity and the second cavity may be filled with a gas having a thermal conductivity lower than air.

The device may be packaged at a wafer or chip level having any one of filters, caps, lenses built at the wafer or chip level.

The device may further comprise through-semiconductor vias (TSVs) placed within at least one of the first and second substrates to connect the IR device to other circuits such as read-out, processing or drive circuits. The device may further comprise at least one solder bump or ball bond coupled with the through-semiconductor via. TSVs in general reduce the complexity of the interconnect length and avoid the use of wires. In general, the TSV's also enable lower capacitance, lower inductance and permit higher speed communications, higher numbers of interconnections and lower power level communication links between circuits. Here, in this case the use of TSV is ideal for contacting the IR device without compromising the sealing of the two cavities. The TSVs used together with the solder bumps or solder balls or stud bumps or ball bonds provide a simple way to connect the device to other circuits and systems.

Walls of the first cavity and the second cavity comprise a reflective material to enhance emission or absorption of IR radiation in the device.

The device may further comprise a reflective material directly underneath the dielectric layer and on the further layer. The reflective material improves emission or absorption in the IR device. The reflective layer, could under very high temperature of operation or high annealing temperature become absorbent of IR which could also be beneficial.

At least one of the first and second substrates may comprise sloped side walls each having a reflective material. The shaped side walls could provide a similar role to that of a reflector to increase the emission or absorption of IR light for the emitter and detector respectively. The reflector could increase the collection and the focus of light which could be advantageous in certain applications.

The further layer may be a continuous layer of the first substrate providing a shallow first cavity. In this example, there is no separate further layer, but the substrate is front etched so that there is a bottom portion of the substrate connecting the two side wall portions.

The further layer may have a similar width compared with a width of the first cavity. This is achieved by using a lower substrate/cap between ball bonds. This has the advantage of reducing the height of the system and make the etching of the TSV smaller and relatively less deep.

The infrared device may be any one of an infrared emitter and an infrared detector.

The infrared device may be a thermal micro-machined infrared device.

The infrared device may be (directly) connected above an application specific integrated circuit (ASIC). The ASIC may comprise any of the drive circuitry, read-out and amplifying circuits, memory or processing cells, state-machines or micro-controllers.

In one embodiment, the first substrate has a greater width compared to the second substrate, and wherein the dielectric layer extends on the entire width of the first substrate.

The device may further comprise at least one bond pad on the dielectric layer outside the second substrate.

The device may further comprise a wire connected to the bond pad. The wire is configured to be connected to another die or circuit.

There is also provided a method of manufacturing an infrared device according to any preceding claim, the method comprising:

fabricating wafers and devices containing IR devices;
forming top and bottom substrates having two cavities, one below and one above the infrared devices each including transmissive layers, filters/caps/lenses/getter layers;
sealing the cavities in vacuum or with a gas with low thermal conductivity by means of bonding, adhesive layers, glues;
forming through semiconductor vias on either bottom or top substrates to connect the IR device;
forming solder bumps and/or 3D interconnections; and
singulating each infrared device.

Compared to state-of-the-art IR devices, the devices disclosed here will have the following advantages:
(i) Lower cost of packaging, as packaging is done at wafer level
(ii) No need for die attach as this is done at wafer level
(iii) Smaller form factor, as the wafer level packaging would result in very compact small devices with solder balls attached, ready to be mounted onto a dedicated ASIC (Application Specific Integrated Circuit) which could contain drive, reading and processing analogue or digital circuits or directly onto Printed Circuit Boards (PCBs) to be used in the systems.
(iv) Significantly lower cost, as the component cost is often dictated by the package cost rather than device die
(v) Better performance. Packaging in vacuum could lead to factor of 2 improvement in performance for both emitters and detectors.

BRIEF DESCRIPTION OF THE PREFERRED EMBODIMENTS

Some preferred embodiments of the disclosure will now be described by way of example only and with reference to the accompanying drawings, in which.

DETAILED DESCRIPTION OF THE PREFERRED EMBODIMENTS

Generally speaking, the disclosure is a thermal infrared device in a hermetically sealed chip-level package using a wafer-level or chip-level assembly. The device comprises a thermal Infrared emitter or detector in a thin dielectric membrane, supported by a first semiconductor substrate featuring a cavity, a second semiconductor substrate above the dielectric layer, an optically transmissive material connected to either the first or second semiconductor material, and an additional substrate connected to either the first or second semiconductor material to hermetically seal the device. The Infrared emitter and detectors are connected to external circuits such as drive, read-out or processing circuits with through-semiconductor or through wafers vias also known as through-silicon vias (TSVs). These circuits could be integrated in an Application Specific Integrated Circuit (ASIC) which can contain both analogue and digital blocks. Solder balls, or solder bumps could be used between the IR device and the ASIC and the IR device could be placed on top of the ASIC to minimise the form factor. Optionally the circuits could be monolithically integrated in the same silicon substrate as the infrared emitter or detector structure and the TSV connections could be used to connect these circuits to the board. The ASIC could contain drive and readout circuitry of the Infrared emitter or detector, analogue frontend to the emitter and detector respectively and analogue or digital processing and output stages. The ASIC could also contain a state machine, a micro-controller or micro-processor and memory cells, Some examples of the device are given in the accompanying figures.

Figure 1:
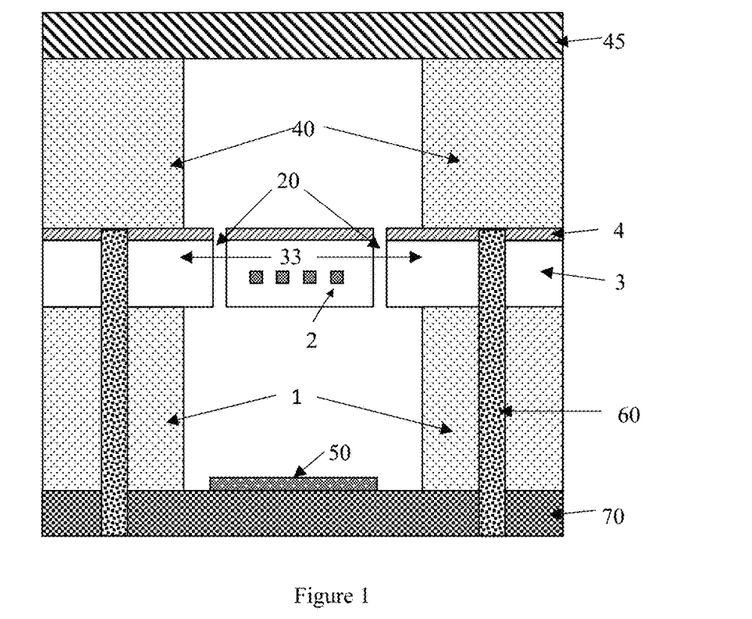
FIG. 1 shows a micro-machined thermal infrared emitter packaged at chip level in vacuum by using a getter material.

FIG. 1 shows an exemplary chip-level packaged infrared emitter. It comprises a dielectric layer 3 supported by a first semiconductor substrate 1 which has a cavity. A passivation 4 may be on the dielectric layer 3. A heater 2 is embedded within the dielectric membrane 3, which when powered to a high temperature emits infrared radiation. A second semiconductor substrate 40 with a cavity is attached on top of the dielectric layer 3, and an optically transmissive layer 45 is attached to the second semiconductor substrate 40. It will be understood that the dielectric layer 3 has a dielectric membrane region 33. The dielectric membrane region 33 is located immediately adjacent to the cavities of the first and second substrates 1, 40. The dielectric membrane region 33 corresponds to the area above or below the area of the cavities of the substrates 1, 40. The dielectric membrane 33 has one or more holes 20, which connect the cavities in the two semiconductor substrates, for pressure equalisation. An additional layer 70 is attached to the first semiconductor substrate 1 to hermetically seal the cavity. A getter material 50 maintains a vacuum within the two cavities. The getter material 50 is generally a reactive material placed in vacuum. Through Semiconductor Vias (TSVs) (also known as Through Silicon vias or through wafer vias) 60 allow electrical connection to the heater from the base of the package.

Additional connection could be made for temperature sensors if present in the device (not shown).

In one embodiment, the dielectric layer 3, the dielectric membrane region 33, and passivation 4 can comprise silicon dioxide, silicon nitride and/or aluminium oxide. The heater 3 can be a resistive heater made of a CMOS material such as aluminium, polysilicon, crystalline silicon, tungsten, copper or titanium, or a non-CMOS material such as platinum or gold. Alternatively, the heater can also be a MOSFET heater.

In one example, the membrane region 33 is formed when the cavity is formed by bulk etching or surface etching and the membrane region corresponds to the dielectric region which is immediately above or below the cavities. The bulk etching can be done by Deep Reactive Ion Etching (DRIE) or wet etching using TMAH or KOH. The surface etching can be done by using chemical etching. The DRIE has the advantage of resulting in straight semiconductor walls and minimal area consumption. The surface etching requires surface holes through which the chemical etcher is released in the substrate. These membranes are slightly more fragile using this technique, but they offer lower power consumption. In the case of surface etching layer 70 may not be needed.

In one embodiment, the dielectric membrane 33 and the dielectric layer 3 can also have a metal plate, or plasmonic layers on it to improve either the temperature uniformity or the emissivity/absorbance of the membrane.

The dielectric membrane 33 and/or the heater 2 can have a rectangular shape, a near rectangular shape with rounded corners to minimise stress at the corners or a circular shape The optically transmissive layer 45 can be an infrared window with a large pass band, an infrared filter with a narrow pass band, or an infrared lens. For example, a narrow band filter centred at a wavelength of 4.26 µm would be of interest for $CO_2$ gas detection. A broadband window around 8-14 µm could be of interest for human presence detection.

Figure 2:
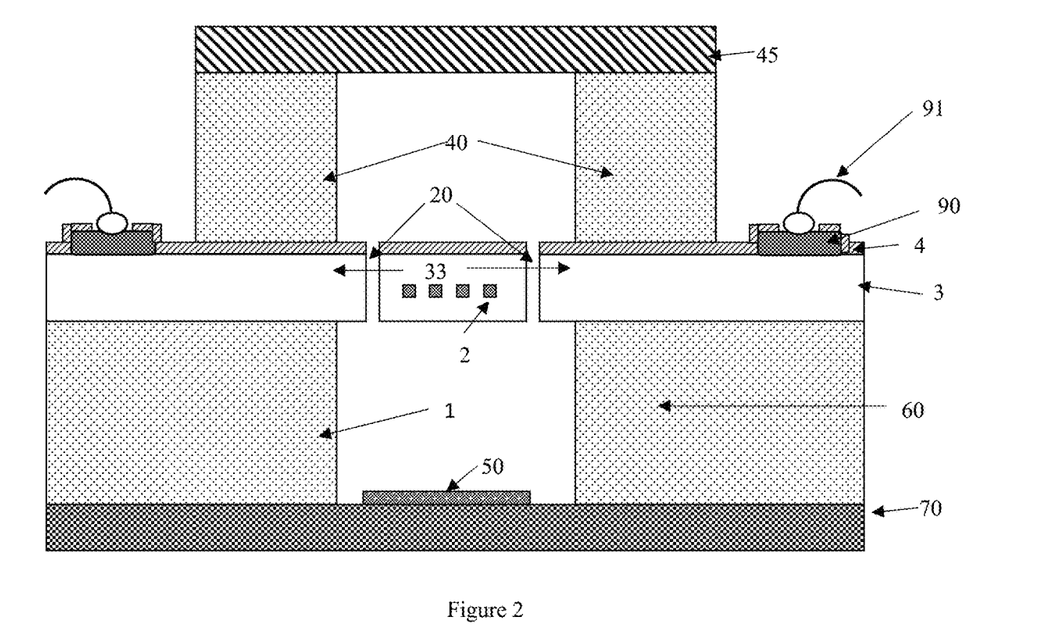
FIG. 2 shows an alternative micro-machined thermal infrared emitter in a chip level package in which the IR emitter die is larger than the top substrate, allowing bond pads to connect outside.

FIG. 2 shows an alternative chip-level packaged infrared emitter. Many features of the emitter of FIG. 2 are the same as those in FIG. 1, except that the first semiconductor substrate 1 and dielectric layer 3 are much larger than the second semiconductor substrate 40. This allows bond pads 90 to be put on the first semiconductor substrate 1 and dielectric layer 3, removing the need for through silicon vias. The passivation layer 4 is not present over the bond pads 90. Wires 91 can be bonded to the bond pads and attached to a lead frame of the package or to the pads of another die or circuit such as an ASIC.

Figure 3:
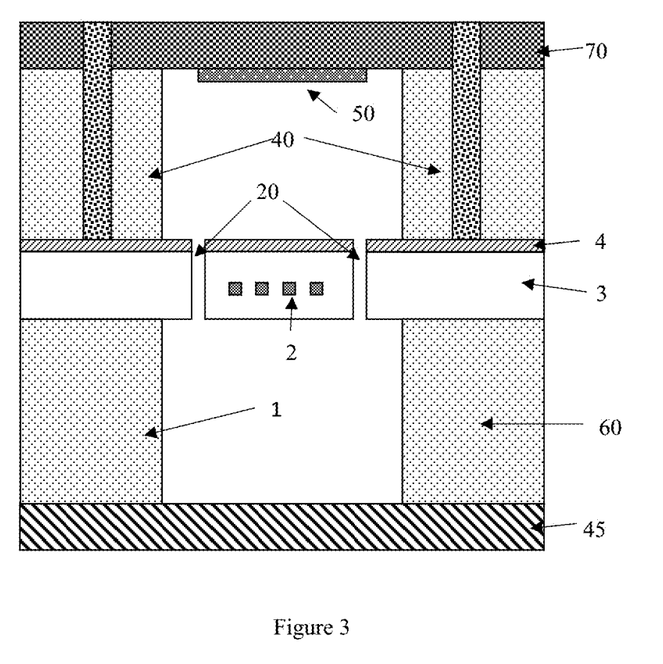
FIG. 3 shows an alternative micro-machined thermal infrared emitter in a chip level vacuum package where the window, filter or lens is at the bottom and the device can be mounted on a PCB by a flip chip method.

FIG. 3 shows an alternative chip-level packaged infrared emitter. In the embodiment of FIG. 3, the optically transmissive layer 45 is attached to the first semiconductor substrate 1, and the additional layer 70 is attached to the second substrate 40. The getter material 50 is also located in the cavity of the second substrate 40. Apart from these features, other features are the same as those of FIG. 2 and therefore carry the same reference numbers. Advantageously, such a device can be mounted on a PCB by a flip-chip method.

Figure 4:
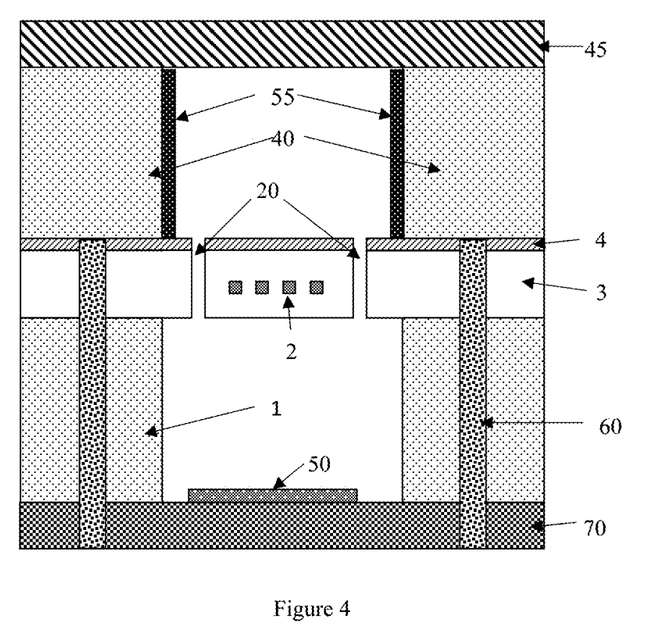
FIG. 4 shows an alternative micro-machined thermal infrared emitter with a reflective coating on the walls of the top substrate to improve the direction of the IR radiation.

FIG. 4 shows an alternative chip-level packaged infrared emitter. Many features of the device of FIG. 4 are the same as those shown in FIG. 1, except that, in this embodiment, the cavity of the second semiconductor substrate 40 has the walls coated with an IR reflective material 55. This can improve the direction of emission of the IR emitter and avoid additional absorption losses in the semiconductor substrate 40.

Figure 5:
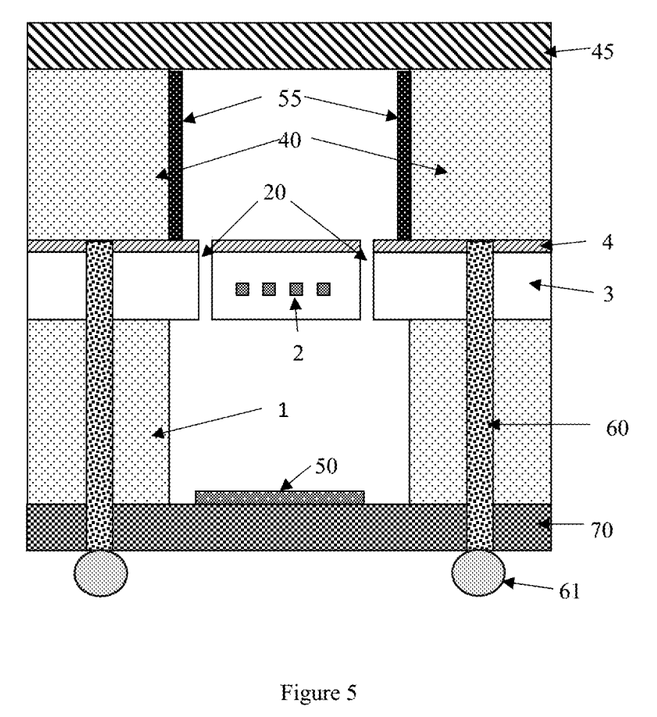
FIG. 5 shows an alternative infrared emitter in which solder bumps have been added at wafer of chip level.

FIG. 5 shows an alternative IR emitter based on the embodiment of FIG. 4, where solder bumps 61 have been added at wafer level or chip level. Advantageously, the solder bumps (or solder balls) 61 would make the connection between the device and the ASIC or the PCB. The remaining features and reference numerals are the same as those of FIG. 4.

Figure 6:
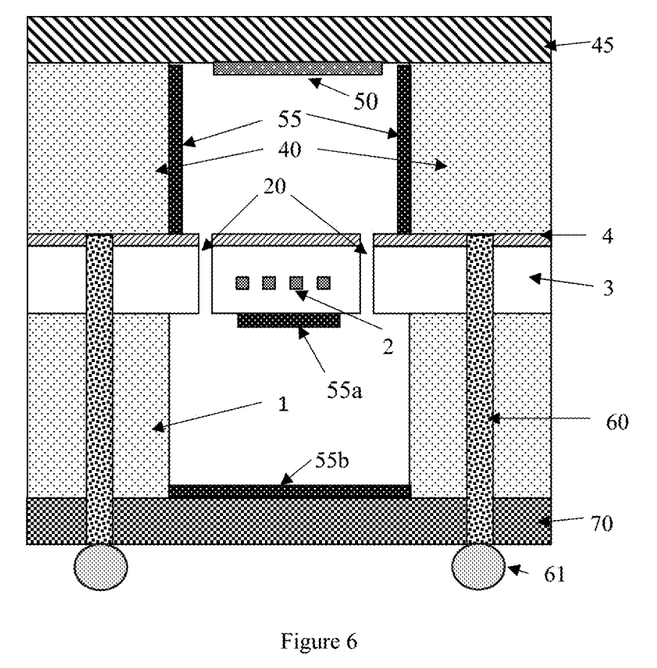
FIG. 6 shows an alternative IR emitter with reflective layers.

FIG. 6 shows an alternative IR emitter with reflective layers. The structure of FIG. 6 is a variation of the structure of FIG. 5, where IR reflective layers 55a and/or 55b are formed directly under the dielectric membrane 33 or above the layer 70 to increase the IR emission or absorption. In one embodiment, these layers can be made of an IR reflective material such as gold, silver or aluminium or Bragg type reflectors of dielectric stacks of high-n and low-n materials. In this embodiment, the getter material 50 is located underneath the optically transmissive layer 45.

Figure 7:
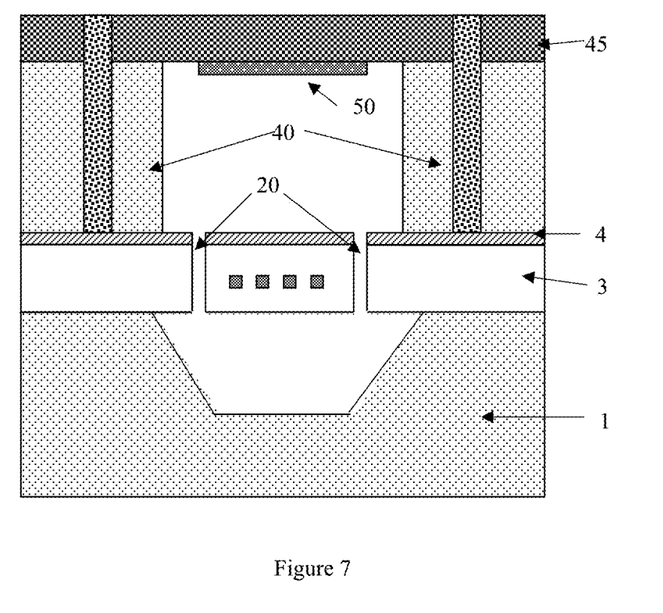
FIG. 7 shows an alternative structure formed using a front side etch.

FIG. 7 shows an alternative IR emitter structure where a front etch (using surface micromachining) is used, and a shallower cavity is present below the dielectric membrane 33, while the semiconductor substrate 1 is present below the cavity. Advantageously, this removes the need for the layer 70 and can lead to a simpler fabrication process.

Figure 8:
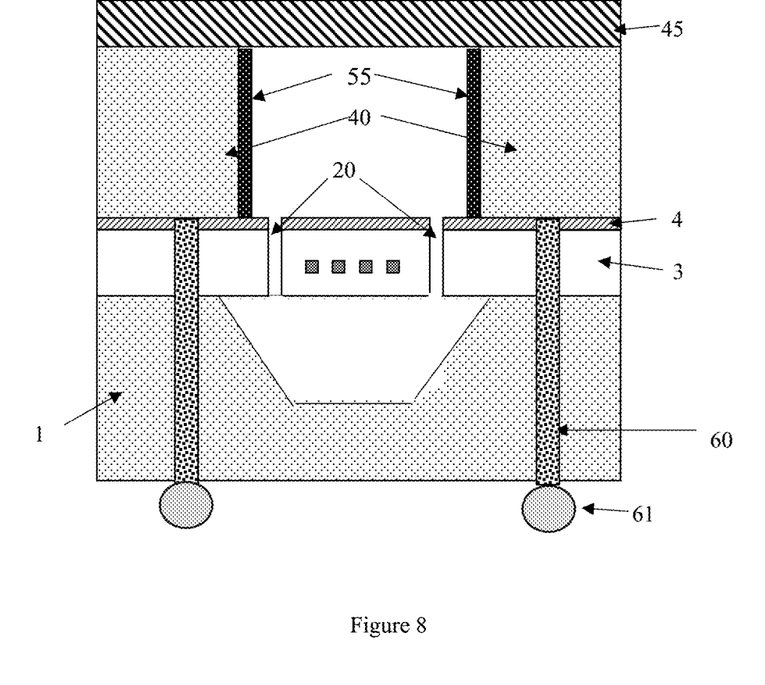
FIG. 8 shows an alternative IR emitter formed by a front side etch and having TSVs and solder bumps.

FIG. 8 shows an alternative IR emitter formed by a front side etch and having TSVs and solder bumps. FIG. 8 is based on FIG. 7 and shows the combination of front etching with TSV and solder bumps 61. A getter layer could be provided in the top of the bottom cavity (not shown).

Figure 9:
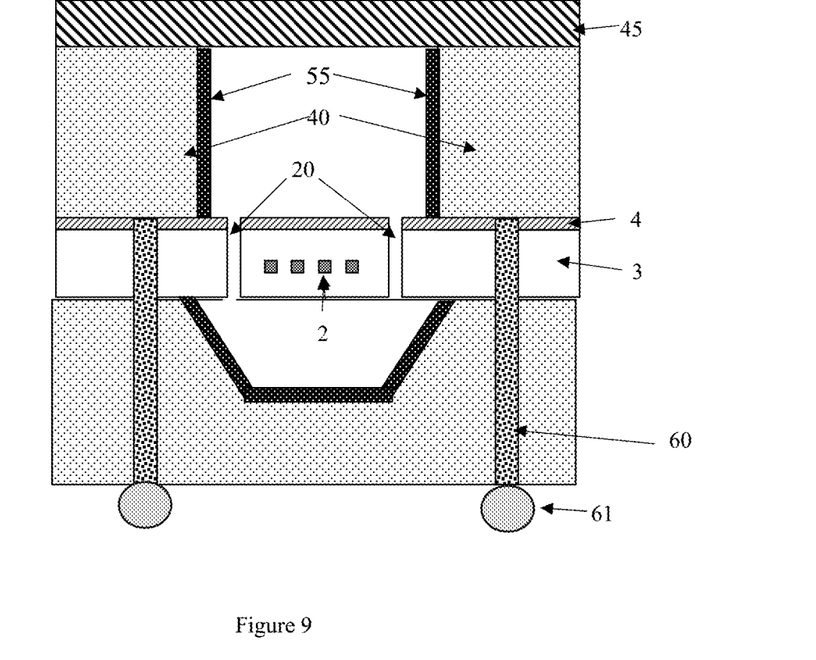
FIG. 9 shows an alternative IR emitter with a front side etch and reflective metal at the bottom of the cavity.

FIG. 9 shows an alternative IR emitter with a front side etch and reflective metal at the bottom of the cavity. FIG. 9 is based on FIG. 7 with an added IR reflective metal placed at the bottom of the cavity to increase the emission and reduce the absorption of IR in the silicon substrate. Other features and reference numerals are the same as those of FIG. 7.

Figure 10:
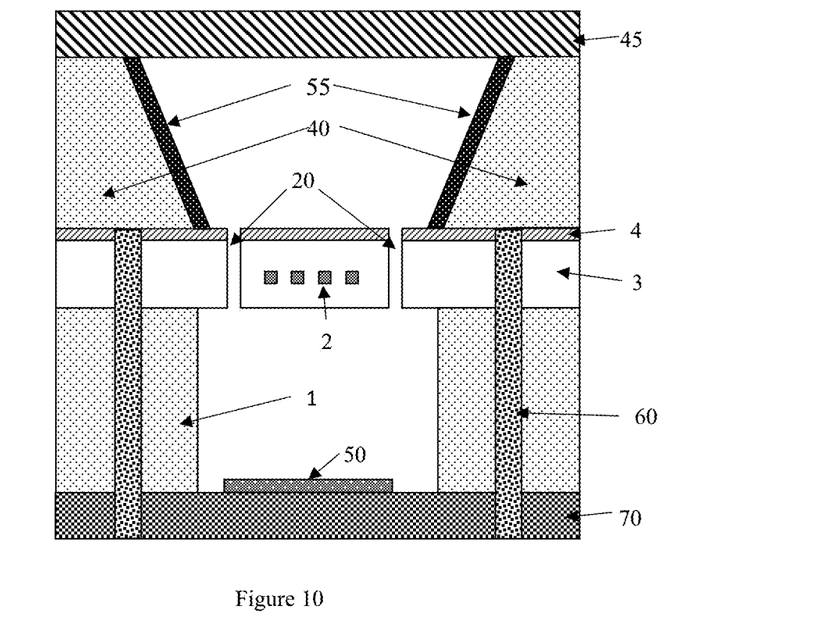
FIG. 10 shows an alternative micro-machined thermal infrared emitter with a reflective coating on the walls of the top substrate to improve the direction of the IR radiation, where the top substrate has angled sidewalls, possibly formed by KOH (Potassium Hydroxide) etching.
Figure 11:
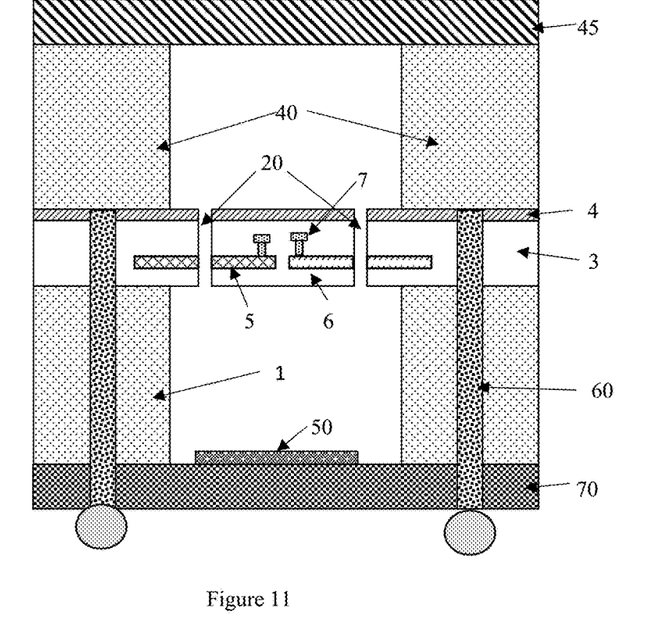
FIG. 11 shows a micro-machined thermopile based IR detector in a chip level vacuum package.

FIG. 10 shows an alternative micro-machined thermal infrared emitter with a reflective coating on the walls of the top substrate to improve the direction of the IR radiation, where the top substrate has angled sidewalls, possibly formed by KOH (Potassium Hydroxide) etching. The cavity of the second semiconductor substrate 40 has sloping sidewalls, and the sidewalls are coated with an IR reflective material 55. The slanted or shaped side walls could provide a similar role to that of a reflector to increase the emission or absorption of IR light for the emitter and detector respectively. FIG. 11 shows a micro-machined thermopile based IR detector in a chip level vacuum package according to one embodiment. The infrared detector is based on a thermopile, comprising one or more strip of two different materials 5 and 6. In one embodiment, the materials can be a p-type or n-type polysilicon or crystalline silicon, and connected together with a metal 7. In other embodiments, the thermopile material can also be a metal such as aluminium, tungsten, copper or titanium.

Figure 12:
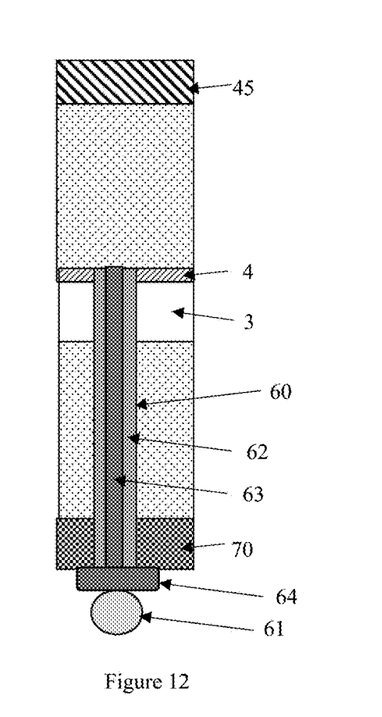
FIG. 12 shows a detailed representation of the Through-Semiconductor-Vias (TSVs)

FIG. 12 shows a detailed representation of the Through-Semiconductor-Vias (TSVs)—also known as Through Silicon Vias or Through Wafer Vias 60. The TSVs, 60 may comprise a highly conductive material, such as Copper (Cu), Tungsten (W) or highly doped polysilicon, a dielectric material such as silicon dioxide or nitride, 62 and a liner or a refractory metal barrier such as Ti, TiN, Ta, or TaN (not shown) sandwiched between the conductive material 63 and the dielectric 62. Bonding pads, made of conductive material (such as Copper, Tungsten or Aluminium) could be provided between the solder bumps or balls 61. The solder bumps 61 could also be made of a metal such as Copper, Nickel, Aluminium or combination of metals.

Figure 13:
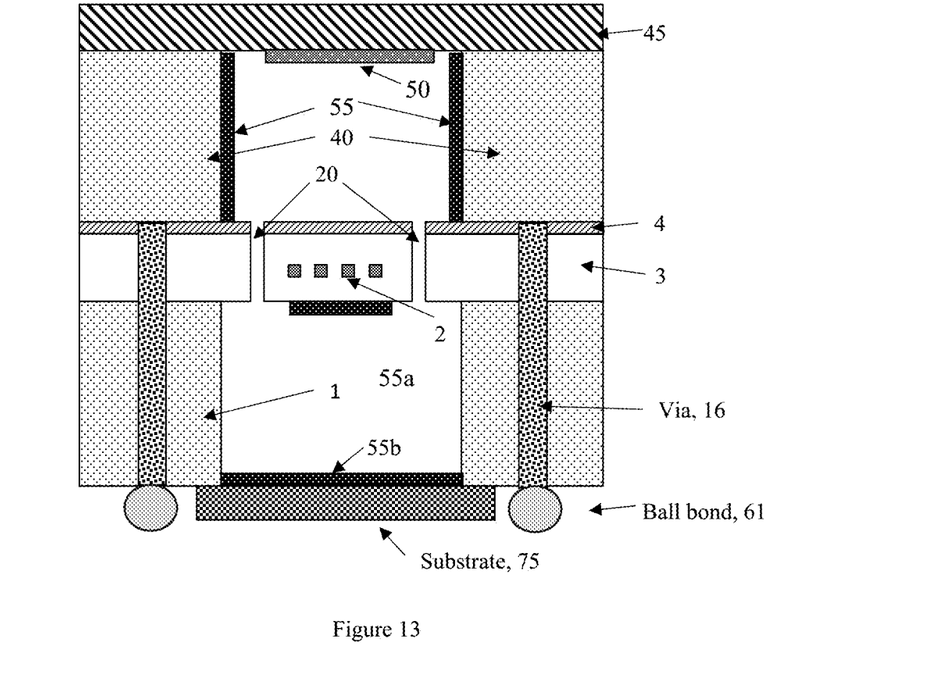
FIG. 13 shows an alternative embodiment of the device which illustrates the possibility of using a lower substrate/cap between ball bonds.

FIG. 13 shows an alternative embodiment of the device which illustrates the possibility of using a lower substrate/cap between ball bonds. The lower substrate/cap 75 between the ball bonds 61 has the advantage of reducing the height of the system and make the etching of the vias significantly less challenging (as they will be less deep). Additionally the height of the entire device will be smaller. This is advantageous in what concerns both cost and form factor.

Figure 14:
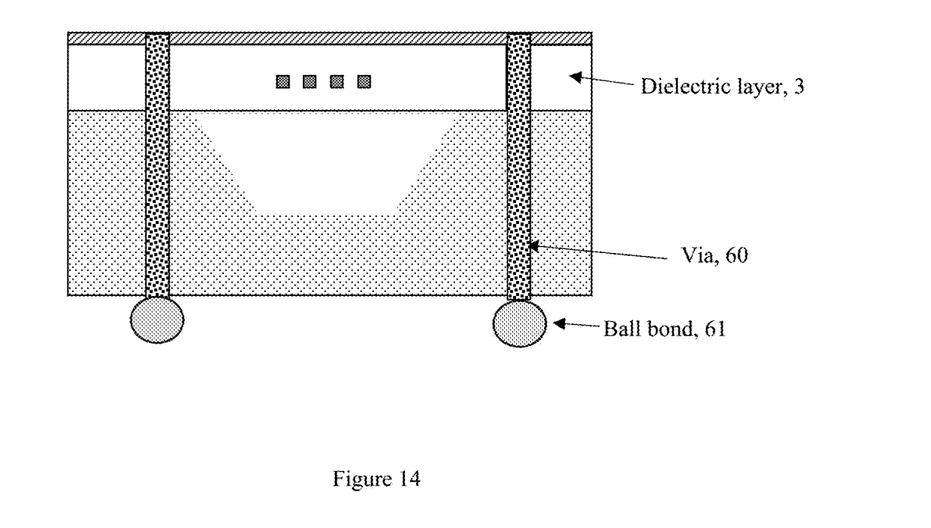
FIG. 14 shows a variation of the disclosure where the membrane of the emitter/detector is only partially sealed to improve efficiency.

FIG. 14 shows a variation where the membrane of the emitter/detector is partially sealed to improve efficiency. The device features front side etching with 'plug-up' holes (not shown) in the dielectric layer 3 to form the cavity. Such holes are subsequently filled after sealing the cavity in vacuum or with a gas with low thermal conductivity. TSVs 60 are present for outside connections. Alternatively bond pads can be placed on top of the structure (as shown in FIG. 2), onto which bond wires are attached (not shown here).

Figure 15:
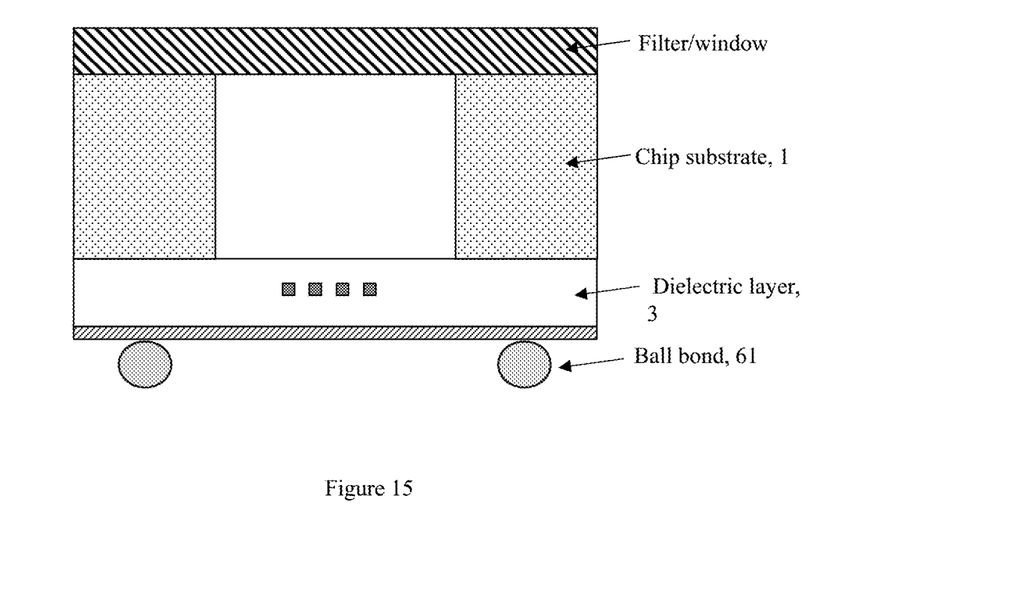
FIG. 15 shows an alternative variation of the disclosure where the membrane of the emitter/detector is only partially sealed to improve efficiency.

FIG. 15 shows an alternative variation where the dielectric layer 3 of the emitter/detector is partially sealed to improve efficiency. The device features back-side etching and bond pads 61 but no TSVs.

Figure 16:
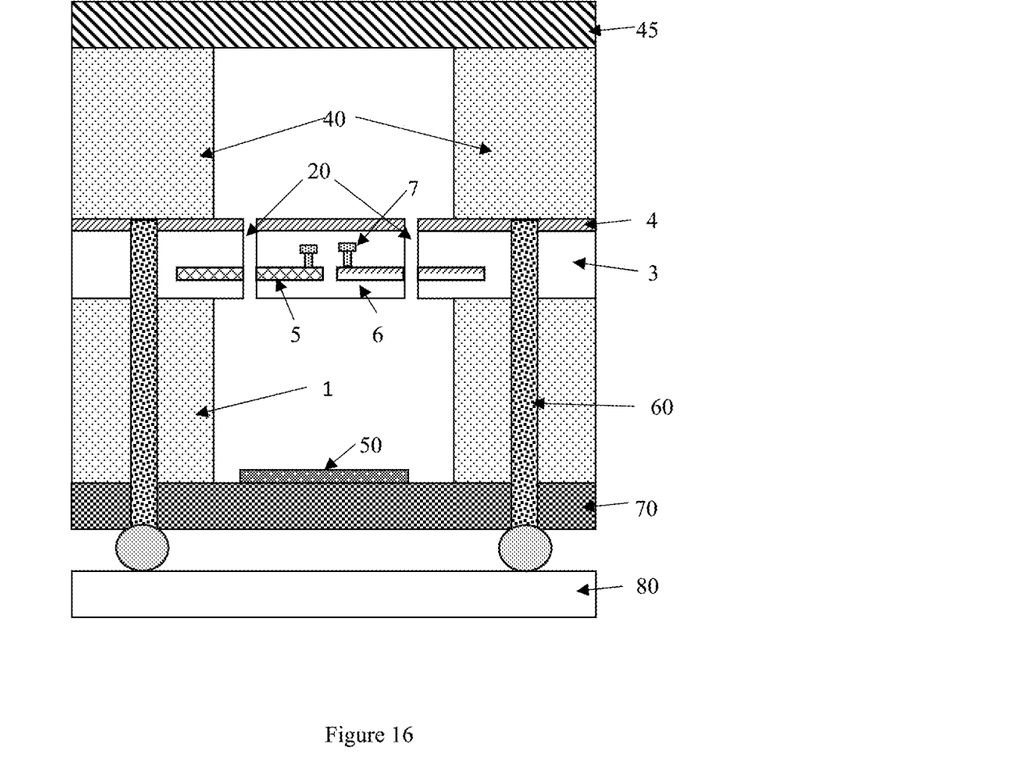
FIG. 16 shows a micro-machined thermopile based IR detector in a chip level vacuum package attached with solder balls to an ASIC or a printed circuit board.

FIG. 16 shows a micro-machined thermopile based IR detector in a chip level vacuum package placed on top of the ASIC 80 and using solder balls to connect to the ASIC. Similar drawings could be made for other IR devices described here. Placing the IR device on top of the ASIC is advantageous to reduce the form factor.

Figure 17A:
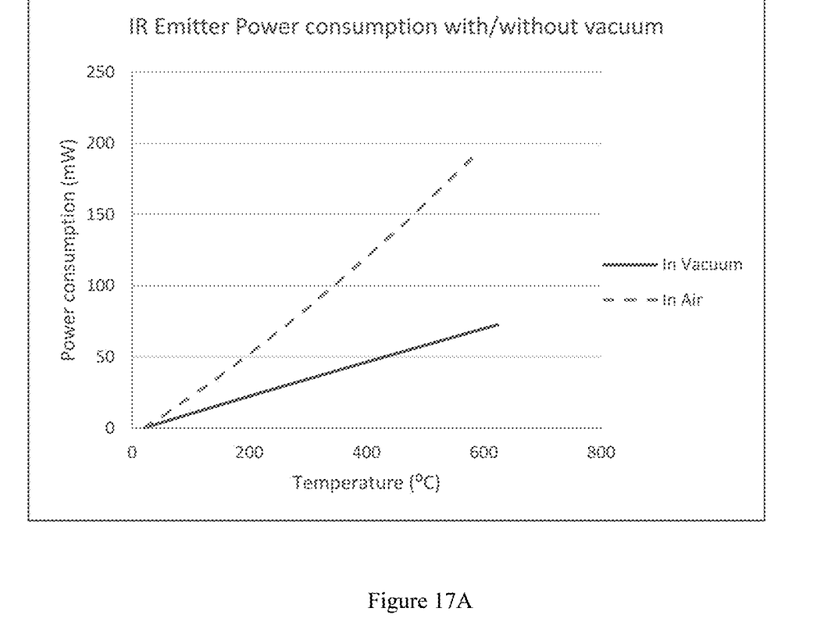
FIG. 17A illustrates a graph that shows the IR emitter power consumption with/without vacuum.

FIG. 17A shows a graph of power consumption of an IR emitter in air and in vacuum. In vacuum, (both sides of the membrane) the required power consumption is less than half of that required in air.

Figure 17B:
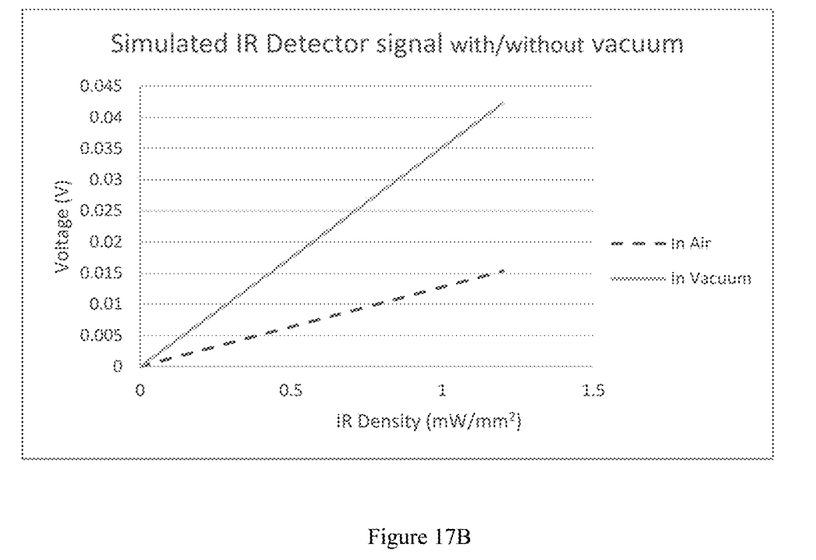
FIG. 17B illustrates a graph that shows the simulated IR detector signal with/without vacuum.

FIG. 17B shows the simulation of the signal on a thermopile IR detector—where the signal is more than double if it is in a vacuum (both sides of the membrane).

Figure 18:
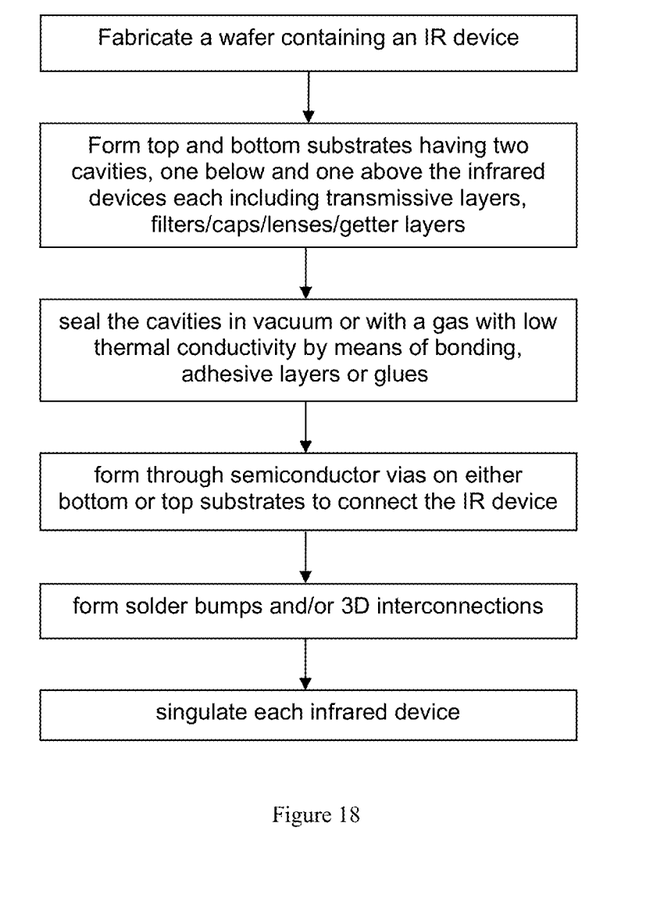
FIG. 18 illustrates an exemplary flow diagram outlining the manufacturing steps of an IR device in accordance with the present disclosure.

FIG. 18 illustrates an exemplary flow diagram outlining the manufacturing method of the IR device.

LIST OF REFERENCE NUMERALS 1 first semiconductor substrate
2 heater
3 dielectric layer
4 passivation layer
20 holes in dielectric membrane
33 dielectric membrane region in the dielectric layer 3
40 second semiconductor substrate
45 optically transmissive layer
50 getter material
55 IR reflective material
55a/55b IR reflective layers
60 Through silicon vias
61 Solder bumps
62 dielectric
63 conductive material
70 additional layer
75 lower substrate cap
80 ASIC
90 Pads
91 Bond wires The skilled person will understand that in the preceding description and appended claims, positional terms such as 'above', 'overlap', 'under', 'lateral', etc. are made with reference to conceptual illustrations of an apparatus, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. An Infrared (IR) device comprising:
a first substrate comprising a first cavity;
a dielectric layer disposed on the first substrate;
a second substrate disposed on the dielectric layer and on the opposite side of the first substrate, the second substrate having a second cavity;
an optically transmissive layer attached to one of the first and second substrates;
a further layer provided to the other of the first and second substrates so that the IR device is substantially closed;
wherein holes are provided through the dielectric layer so that a pressure in the first cavity is substantially the same level as a pressure in the second cavity; and
further comprising a reflective material directly underneath the dielectric layer and on the further layer.

2. A device according to claim 1, wherein the first cavity and the second cavity have vacuum with a substantially same pressure level.

3. A device according to claim 2, further comprising a getter material within one of the cavities to maintain the vacuum.

4. A device according to claim 1, wherein the first cavity and the second cavity are filled with a gas having a thermal conductivity lower than air.

5. A device according to claim 1, wherein the device is packaged at a wafer level having any one of filters, caps, lenses built at the wafer level.

6. A device according to claim 1, further comprising through-semiconductor vias placed within at least one of the first and second substrates to connect the IR device to other circuits.

7. A device according to claim 6, further comprising at least one bonding ball coupled with the through-semiconductor via.

8. A device according to claim 1, wherein walls of the first cavity and the second cavity comprise a reflective material to enhance emission or absorption in the IR device.

9. A device according to claim 1, wherein at least one of the first and second substrates comprises sloped side walls each having a reflective material.

10. A device according to claim 1, wherein the further layer is a continuous layer of the first substrate providing a shallow first cavity.

11. A device according to claim 1, wherein the further layer has a similar width compared to a width of the first cavity.

12. A device according to claim 1, wherein the infrared device is any one of an infrared emitter and an infrared detector.

13. A device according to claim 1, wherein the infrared device is a thermal micro-machined infrared device.

14. A device according to claim 1, wherein the infrared device is directly connected above an application specific integrated circuit (ASIC).

15. A device according to claim 14, wherein the ASIC comprises any of the drive circuitry, read-out and amplifying circuits, memory or processing cells, state-machines or micro-controllers.

16. A device according to claim 1, wherein the first substrate has a greater width compared to the second substrate, and wherein the dielectric layer extends on the entire width of the first substrate.

17. A device according to claim 16, further comprising at least one bond pad on the dielectric layer outside the second substrate.

18. A device according to claim 17, further comprising a wire connected to the bond pad, wherein the wire is configured to be connected to another die or circuit.

19. A method of manufacturing an infrared device according to claim 1, the method comprising:

fabricating wafers and devices containing IR devices;

forming top and bottom substrates having two cavities, one below and one above the infrared devices each including transmissive layers, filters/caps/lenses/getter layers;

sealing the cavities in vacuum or with a gas with low thermal conductivity by means of bonding, adhesive layers, glues;

forming through semiconductor vias on either bottom or top substrates to connect the IR device;

forming solder bumps and/or 3D interconnections; and singulating each infrared device.

* * * * *